US006744323B1

(12) United States Patent
Moyal et al.

(10) Patent No.: US 6,744,323 B1
(45) Date of Patent: Jun. 1, 2004

(54) METHOD FOR PHASE LOCKING IN A PHASE LOCK LOOP

(75) Inventors: Nathan Y. Moyal, Austin, TX (US); Mark R. Gehring, Portland, OR (US); Russell Moen, Tigard, OR (US); Lawrence Ragan, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/943,149

(22) Filed: Aug. 30, 2001

(51) Int. Cl.[7] .................................................. H03L 7/00
(52) U.S. Cl. ................... 331/1 A; 331/DIG. 2; 375/376
(58) Field of Search ............. 331/DIG. 2, 1 A, 331/16, 18, 78, 34, 25; 375/374, 376; 327/156, 158, 147, 149

(56) References Cited

U.S. PATENT DOCUMENTS

| 5,142,247 A | * | 8/1992 | Lada et al. ................. 331/14 |
| 5,159,292 A | * | 10/1992 | Canfield et al. ............. 331/1 A |
| 5,260,979 A | * | 11/1993 | Parker et al. ............... 375/366 |
| 5,334,952 A | * | 8/1994 | Maddy et al. ............... 331/1 A |
| 6,005,904 A | * | 12/1999 | Knapp et al. ............... 375/376 |
| 6,236,275 B1 | * | 5/2001 | Dent .......................... 331/1 A |
| 6,236,278 B1 | * | 5/2001 | Olgaard ...................... 331/25 |
| 6,359,950 B2 | * | 3/2002 | Gossmann et al. ......... 375/376 |
| 6,366,174 B1 | * | 4/2002 | Berry et al. ................. 331/78 |

FOREIGN PATENT DOCUMENTS

DE         19946200 A1    *  5/2001   ............. H03L/7/10

OTHER PUBLICATIONS

Gotz et al. Pub. No.: US 2002/0153959.*
"A 6–GHz Integrated Phase–Locked Loop Using AlGaAs/GaAs Heterojunction Bipolar Transistsors", By Aaron W. Buchwald et al., IEEE Journal of Solid–State Circuits, vol. 27, No. 12, Dec. 1992, pp. 1752–1762.

* cited by examiner

Primary Examiner—Michael J. Tokar
Assistant Examiner—Linh V Nguyen
(74) Attorney, Agent, or Firm—Christopher P. Maiorana, P.C.

(57) ABSTRACT

An apparatus comprising a phase lock loop (PLL) and a lock circuit. The PLL may be configured to multiply an input frequency in response to a lock signal. The lock circuit may be configured to generate the lock signal. The PLL may also be configured to select a reference frequency as (i) the input frequency when in a first mode and (ii) a divided frequency of the input frequency when in a second mode.

21 Claims, 4 Drawing Sheets

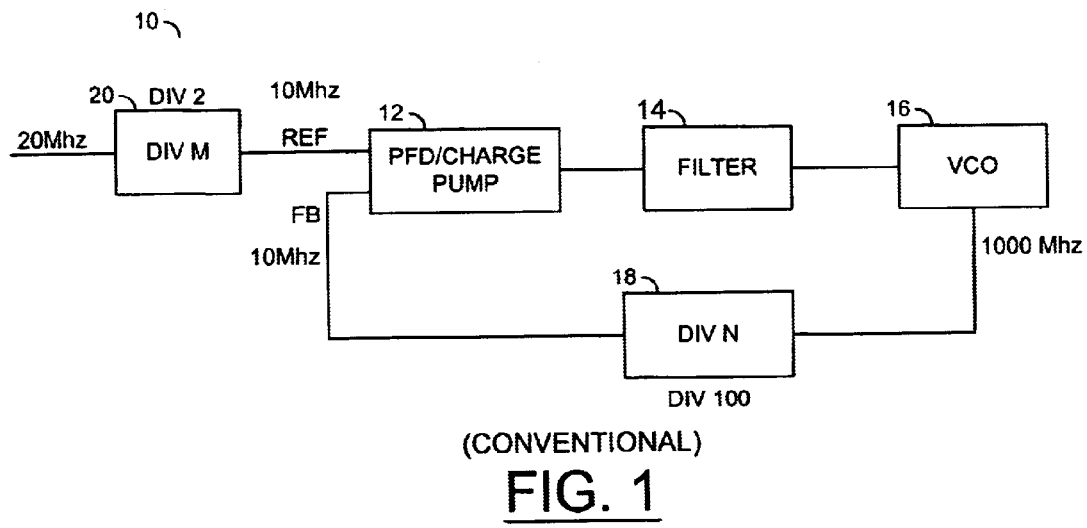
(CONVENTIONAL)
FIG. 1

METHOD FOR PHASE LOCKING IN A PHASE LOCK LOOP

FIELD OF THE INVENTION

The present invention relates to a method and/or architecture for phase acquisition in phase lock loops (PLLs) generally and, more particularly, to a method and/or architecture for acquisition when locking to a new frequency in a PLL.

BACKGROUND OF THE INVENTION

In general, PLLs are considered clock multipliers. For example, an input clock of 10 Mhz can be multiplied by a PLL to yield an output frequency of 1000 Mhz. Ideally, the clock multiplication would result in an output clock that is in perfect phase alignment with the input clock.

Referring to FIG. 1, a conventional PLL architecture 10 is shown. The PLL 10 includes a phase frequency detector (PFD) 12, a filter 14, a voltage controlled oscillator (VCO) 16, and a divider 18. The PFD 12 sends the filter 14 information about the frequency and phase of the reference signal relative to the feedback clock. The filter 14 integrates the filter information into a voltage. The VCO 16 converts the voltage information into a frequency. The divider 18 divides down the higher speed frequency for a comparison by the PFD 12. A divider 20 divides an input frequency before being presented to the PFD 12.

Referring to FIG. 2, a frequency versus time graph 50 is shown. The graph 50 illustrates the lock time of the circuit 10. The graph 50 also illustrates the feedback (FB) frequency of the circuit 10.

One conventional approach, "A 6-Ghz Integrated Phase-Locked Loop Using AlGaAs/GaAs Heterojuntion Bipolar Transistor", IEEE, Journal of Solid-State Circuits, vol. SC-27, pp. 1752–1762, December 1992, discloses fine and coarse control of the VCO. The PLL operates in high gain (Mhz/V) and low gain modes. The high gain mode will typically result in faster lock time while increasing jitter. Once the system is close to locking, the system switches to the lower VCO gain. The switch achieves fast lock time without sacrificing jitter. However, such an approach complicates VCO design. Specifically, additional parasitic effects are created due to the dual gain circuit. The approach also requires complete gain characterization for both non-linear gains.

Another conventional approach includes switching large resistor or small capacitor values in the filter. Such switching results in faster pulse integration from the PFD. However, switching resistors or capacitors of the filter is not preferred, since such switching transistors can interfere with the filter (i.e., the resistance of the pass gates).

Another conventional approach includes switching large currents in the filter. Such switching results in faster, frequency correction due to the large currents charging the filter components faster. However, current switching complicates filter/pump design (i.e., the pump needs to handle multiple levels of currents). Current switching pumps are difficult to implement, and particularly difficult if the pump implements common mode compensation. Furthermore, higher currents result in larger devices and higher parasitic effects. Additionally, such an approach slows the pump speed and increases noise coupling.

SUMMARY OF THE INVENTION

The present invention concerns an apparatus comprising a phase lock loop (PLL) and a lock circuit. The PLL may be configured to multiply an input frequency in response to a lock signal. The lock circuit may be configured to generate the lock signal. The PLL may also be configured to select a reference frequency as (i) the input frequency when in a first mode and (ii) a divided frequency of the input frequency when in a second mode.

The objects, features and advantages of the present invention include providing a method and/or architecture for fast acquisition when locking to a new frequency that may (i) provide simplicity in design, (ii) simplify design implementation methodology, (iii) achieve a faster lock using digital dividers, (iv) be implemented without changes to pre-existing analog blocks, (v) avoid pump headroom/speed issues, since multiple currents are not generally needed, (vi) have lower noise, which, may avoid complex filter design, (vii) be implemented without switching resistors or capacitors, (viii) avoid complex VCO design, (e.g., without multi-gain VCOs), (ix) be easily modified for faster/slower lock rates, and/or (x) enable fast lock/acquisition for simulation purposes.

BRIEF DESCRIPTION OF THE DRAWINGS

These and other objects, features and advantages of the present invention will be apparent from the following detailed description and the appended claims and drawings in which:

FIG. 1 a block diagram of a typical PLL architecture is shown;

DETAILED DESCRIPTION OF PREFERRED EMBODIMENT

Figure 2:
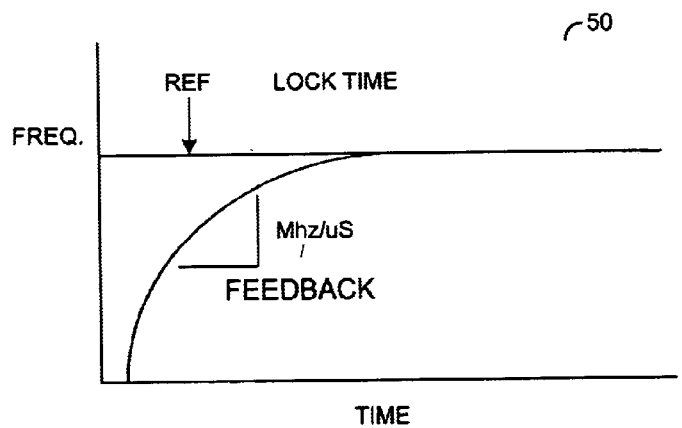
FIG. 2 is a frequency versus time plot of the feedback frequency of the circuit of FIG. 1.
Figure 3:
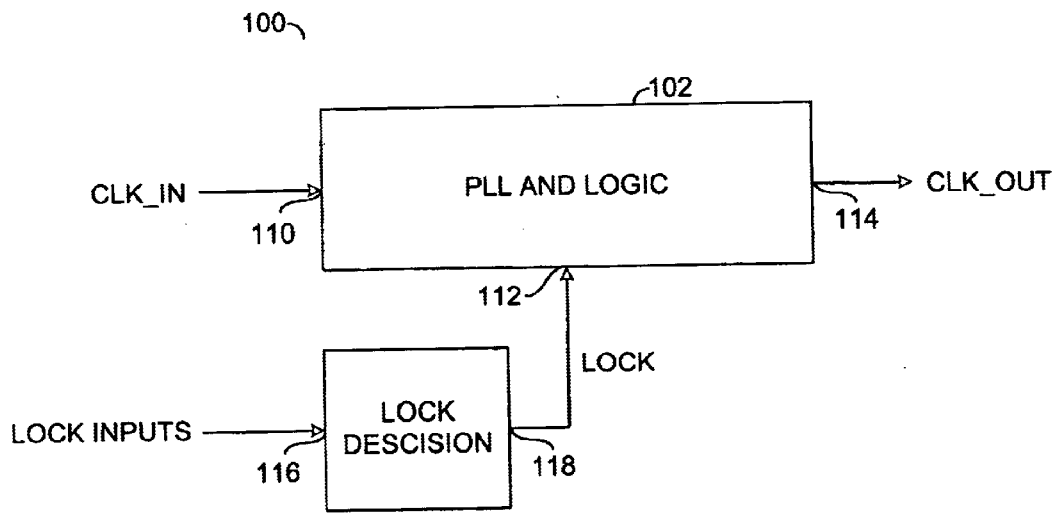
FIG. 3 a block diagram of a preferred embodiment of the present invention is shown.

Referring to FIG. 3, a block diagram of a circuit 100 is shown in accordance with a preferred embodiment of the present invention. The circuit 100 may provide a method and/or architecture for phase and/or frequency acquisition in a phase lock loop (PLL). The circuit 100 may yield a fast acquisition when locking to a new frequency (e.g., frequency hopping). The circuit 100 may achieve faster lock by receiving phase/frequency comparisons at a higher rate. The circuit 100 may also allow for bypassing a reference frequency and a feedback frequency.

The circuit 100 generally comprises a block (or circuit) 102 and a block (or circuit) 104. The circuit 102 may be implemented as a PLL and logic block. The circuit 104 may be implemented as a lock decision block. The circuit 102 may have an input 110 that may receive an input signal (e.g., CLK_IN), an input 112 that may receive a control signal (e.g., LOCK) and an output 114 that may present an output signal (e.g., CLK_OUT). The circuit 104 may have an input 116 that may receive a signal (e.g., LOCK_INPUTS) and an output 118 that may present the signal LOCK. The signal LOCK_INPUTS may receive an internal/external signal such as a reference signal, a feedback signal, an output of a PFD, an output of a filter, an output of a VCO, or other appropriate type signal (to be discussed in connection with FIGS. 5–8).

Figure 4:
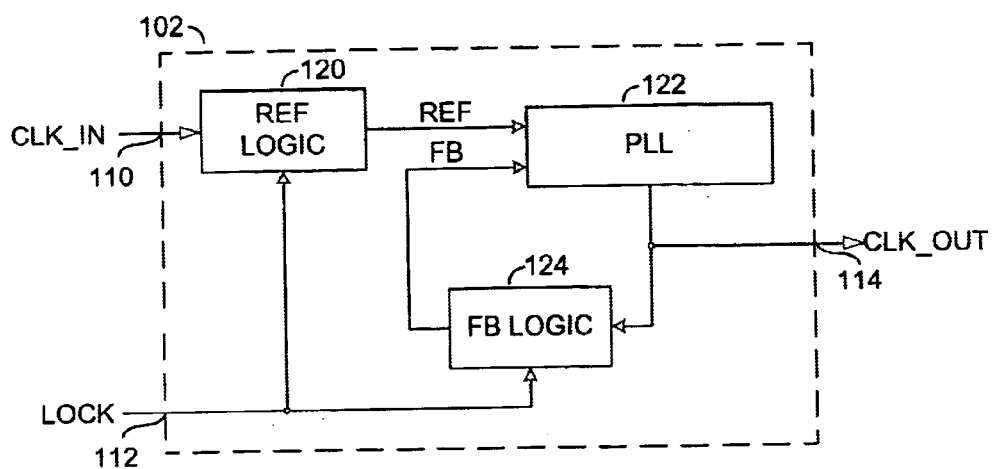
FIG. 4 is a detailed block diagram of the circuit of FIG. 3.

Referring to FIG. 4, a more detailed diagram of the PLL and logic block 102 is shown. The PLL and logic circuit 102 generally comprises a block (or circuit) 120, a block (or circuit). 122 and a block (or circuit) 124. The circuit 120 may be implemented as a reference logic circuit. The circuit 122 may be implemented as a phase lock loop. The circuit 124 may be implemented as a feedback logic circuit. The signal LOCK may be presented to the reference logic block 120 and the feedback logic block 124. In one example, the signal LOCK may be implemented as a multi-bit signal. The multi-bit signal LOCK, may, allow multichannel locking to occur (e.g., one bit for each multichannel shown in FIG. 8). In another example, a first lock may occur after a first predetermined delay (e.g., 100 ms), and a second lock may occur after a second predetermined delay (e.g., 200 ms). Other appropriate delay times may be varied accordingly to meet the design criteria of a particular implementation.

The reference logic block 120 may present a signal (e.g., REF) to a first input of the PLL 122. The feedback logic block 124 may present a feedback signal (e.g., FB) to a second input of the PLL 122. The PLL 122 may present the signal CLK_OUT at the output 114 as well as to an input of the feedback logic block 124.

Figure 5:
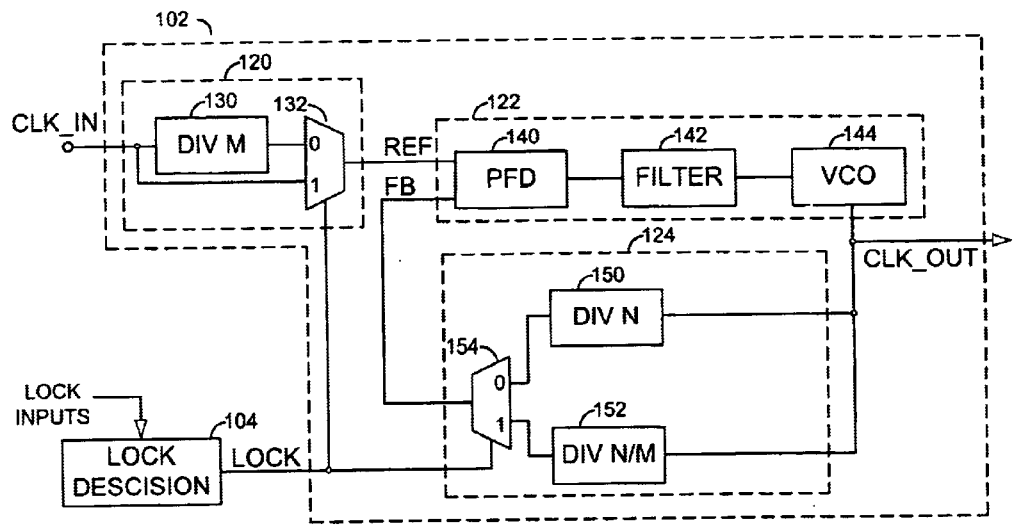
FIG. 5 is a detailed block diagram of the circuit of FIG. 3.

Referring to FIG. 5, a more detailed diagram of the PLL and logic block 102 is shown. The reference logic block 120 generally comprises a divide block (or circuit) 130 and a multiplexer circuit 132. The divide block 130 may have a predetermined divide ratio (e.g., M). The signal CLK_IN may be presented to the divider 130. The output of the divider 130 may be presented to a first input of the multiplexer 132. The signal CLK_IN may also be presented to a second input of the multiplexer 132. The signal LOCK may be presented to the multiplexer 132 to a select input to output. The PLL 122 generally comprises a phase frequency detector (PFD) 140, a filter 142 and a voltage controlled oscillator (VCO) 144. The PFD 140 may receive the signals REF and FB. The PFD 140 may present a signal to the filter 142. The filter 142 may present a signal to the VCO 144. The VCO 144 may generate the signal CLK_OUT.

The feedback logic 124 generally comprises a divider 150 and a divider 152. The divider 150 may have a predetermined divide ratio (e.g., N). The divider 152 may have a predetermined divide ratio (e.g., N/M). The dividers 150 and 152 may each receive the signal CLK_OUT. The divider 150 may present a first input to the multiplexer 154. The divider 152 may present the signal to the second input of the multiplexer 154. The signal LOCK may be presented to the select input of the multiplexer 154. The multiplexer 154 may present the signal FB as either the output of the divider 150 or the output of the divider 152.

Figure 6:
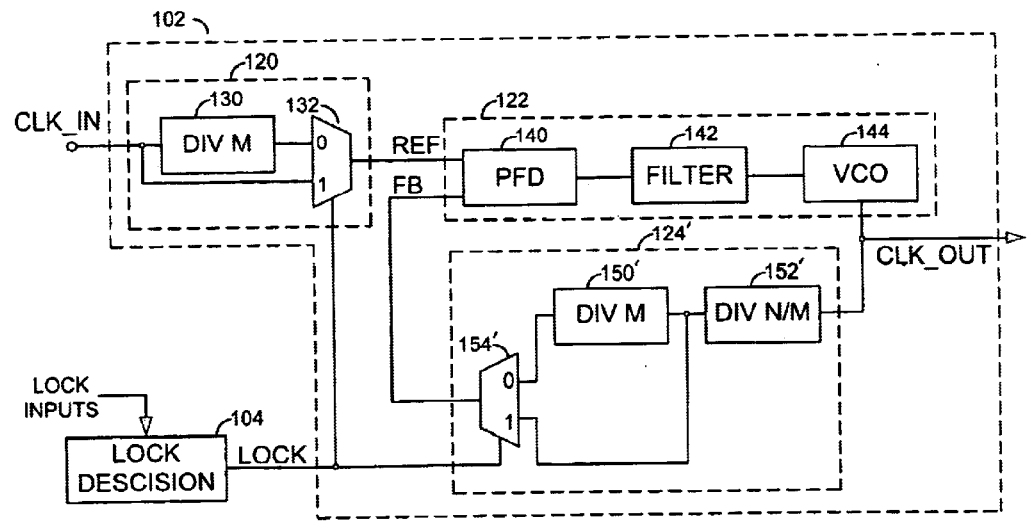
FIG. 6 is a detailed block diagram of an alternate embodiment of the circuit of FIG. 5.

Referring to FIG. 6, an alternate implementation of the feedback logic 124 is shown marked with primed notation. The feedback logic 124' may be similar to the feedback logic 124. The feedback logic 124' may have an alternate configuration of the divider 150', the divider 152' and the. multiplexer 154'. The divider 152' may receive the signal CLK_OUT. The divider 152' may then present a divided signal to the divider 150' and to the second input of the multiplexer 154'. The divider 150' may present a further divided signal to the first input of the multiplexer 154'.

Figure 7:
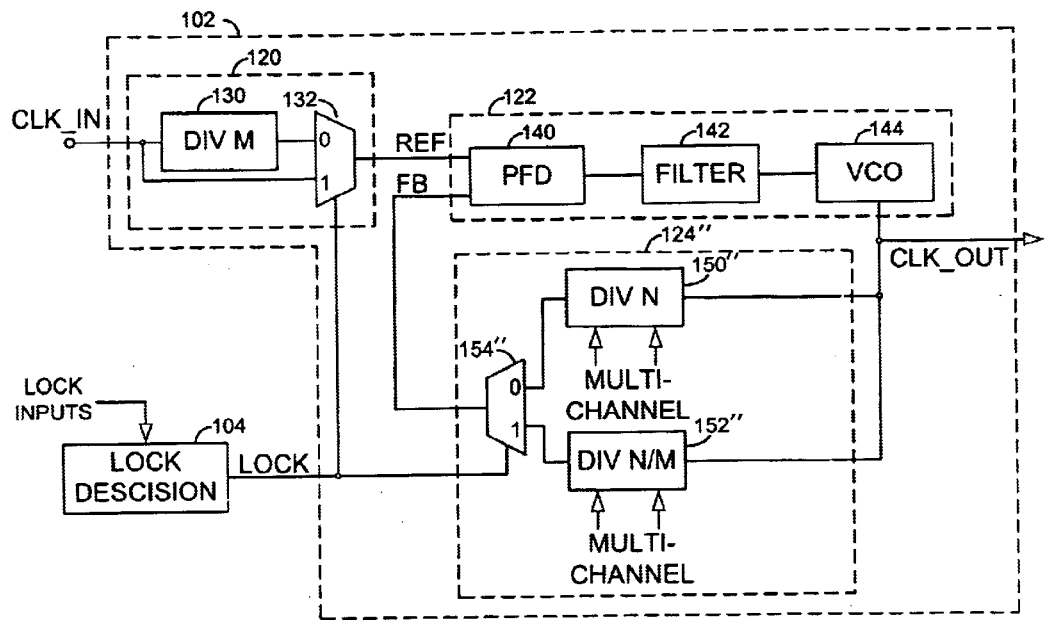
FIG. 7 is a detailed block diagram of a variation of the circuit of FIG. 3.

Referring to FIG. 7, a variation of the feedback logic 124 is shown marked with double primed notation. The feedback logic 124" may be similar to the feedback logic 124. The feedback logic 124" may have an alternate implementation of the divider 150", the divider 152" and the multiplexer 154". The divider 150" and the divider 152" may be implemented as multi-channel dividers. The multi-channel dividers 150" and 152" may be implemented to provide coarse and fine tuning. The divider 150" and the divider 152" may receive the signal CLK_OUT. The divider 150" may present a divided signal to the first input of the multiplexer 154". The divider 152" may present a divided signal to the second input of the multiplexer 154". The divider 150" and the divider 152" may each receive multi-channel *control signals. The multi-channel control signals may control a frequency division of each of the dividers 150" and 152'.

Figure 8:
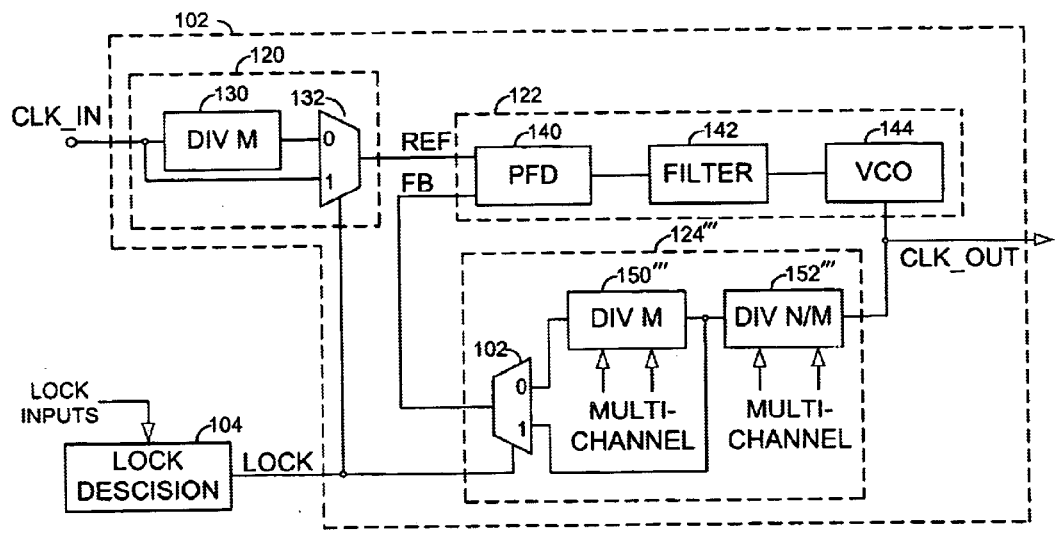
FIG. 8 is a detailed block diagram of an alternate embodiment of the circuit of FIG. 7.

Referring to FIG. 8, an alternate implementation of the feedback logic 124" is shown marked with triple primed notation. The feedback logic 124''' may be similar to the feedback logic 124. The feedback logic 124''' may have an alternate configuration of the divider 150''', the divider 152''' and the multiplexer 154'''. The divider 150''' and the divider 152''' may be implemented as multi-channel dividers. The multi-channel dividers 150''' and 152''' may be implemented to provide coarse and fine tuning. The divider 152''' may receive the signal CLK_OUT. The divider 152''' may then present a divided signal to the divider 150''' and to the second input of the multiplexer 15440 ". The divider 150''' may present a divided signal to the first input of the multiplexer. 154'''. The divider 150''' and the divider 152''' may each receive multi-channel control signals. The multi-channel control signals may control a frequency division of each of the dividers 150''' and 152'''. Additionally, the divider 130 may be implemented as several dividers to allow the signal REF to be adjustable. Such an implementation may allow a number of locking configurations (e.g., coarse to fine lock, multi-level locking such as coarse, medium, fine, very fine, etc.).

The signal LOCK_INPUTS of the FIGS. 5–8 may be implemented as (i) the reference signal REF, (ii) the feedback signal FB, (iii) the output of the PFD 140, (iv) the output of the filter 142, (v) the output of the VCO 144, (vi) or any other appropriate signals of the present invention.

During an initial lock (e.g., a first mode), the circuit 100 may select the pre-divided clock CLK_IN to be passed as the reference clock REF. The circuit 100 may also select an increased feedback divide ratio (e.g., N of the divider 150) to reduce the feedback frequency FB. A bandwidth of the PLL 122 may be such that the phase information via the signal FB is updating the loop at the rate of the higher reference clock REF (e.g., the signal CLK_IN). The output frequency CLK_OUT of the VCO 144 may be:

$$CLK\_OUT = REF/M*(N/M) = REF*N$$

During a final locking (e.g., a second mode), the circuit 100 may select the divided clock CLK_IN/M to be passed as the reference clock REF. The circuit 100 may switch to the second mode when the PLL 122 is closer to the desired final frequency (or locked). The circuit 100 may also select a decreased feedback divide ratio (e.g., N/M of the divider 152) to increase the feedback frequency FB. The output frequency CLK_OUT of the VCO 144 may be:

$$CLK\_OUT = REF*N$$

The decision when to switch from the first mode to the second mode may be set adaptively by the lock detection circuit 104. Alternatively, the lock decision circuit 104 may be implemented as a passively set a timer.

The circuit 100 may synchronize the input REF from the reference and feedback dividers 130, 150 and 152, respectively. Therefore, the circuit may not need additional phase alignment circuits. The circuit 100 may be extended for multiple reference/feedback switching implementations. The circuit 100 may also be implemented for data acquisition. The circuit may be implemented for multi-channel applications. In particular, the circuit may provide coarse tuning and fine tuning. Coarse tuning may be provided by the unique configuration of the circuit 100 in an enhanced mode of operation. Fine tuning may be provided by the circuit 100 in a normal mode of operation. The switching multiplexers 132 and 134 via the lock decision circuit 104 may control a mode of operation of the circuit 100.

The circuit 100 may provide faster lock using digital dividers. The circuit 100 may not need changes to be made for implementation within pre-existing analog systems. The circuit 100 may avoid pump headroom/speed currents, since multiple currents are not generally implemented. The circuit 100 may avoid complex filter design (e.g., no need for switching resistors or capacitors). The circuit 100 may also avoid complex VCO design (e.g., not need a multi-gain VCO). The circuit 100 may allow is switching gain to result in frequency jumping due to improved operating conditions. The circuit 100 may be easily modified for faster/slower lock rates. The circuit 100 may enable fast lock/acquisition for simulation purposes (e.g., if reference low divider values are selected, highest frequency values do not further acquisition).

The circuit 100 may provide a digitally enhanced locking sequence architecture. The circuit 100 may allow a multi-reference/feedback lock implementation via the reference logic block 120, the feedback logic block 124 and the lock decision circuit 104. The circuit 100 may resolve locking issues in an improved manner. The circuit 100 may be implemented for PLL systems and RF systems, that need quick re-lock to multiple frequency channels.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a phase lock loop (PLL) configured to multiply an input frequency to generate an output frequency in response to a multi-bit lock signal; and
   a lock circuit configured to generate said multi-bit lock signal, wherein said PLL is configured to (i) (a) select a reference frequency as said input frequency and (b) select a first feedback ratio, when in a first mode and (ii) (a) select one of a plurality of divided frequencies of said reference frequency to be said input frequency and (b) select a second feedback ratio, when in a second mode, wherein (i) said selected divided frequency is selected in response to said multi-bit lock signal, (ii) a first bit of said multi-bit lock signal selects said first feedback ratio, and (iii) a second bit of said multi-bit lock signal selects said second feedback ratio.

2. The apparatus according to claim 1, wherein said first mode is further configured to increase said first feedback ratio.

3. The apparatus according to claim 2, wherein said second mode is further configured to decrease said second feedback ratio.

4. The apparatus according to claim 1, wherein said lock circuit comprises a lock decision logic circuit.

5. The apparatus according to claim 1, wherein said lock circuit comprises a timer circuit.

6. The apparatus according to claim 1, wherein said lock signal is generated in further response to an internal/external signal.

7. The apparatus according to claim 1, wherein said lock is controlled by a timer.

8. The apparatus according to claim 1, wherein said multi-bit lock is externally controlled by a user.

9. The apparatus according to claim 1, wherein said PLL comprises:
   a first switchable divider configured to generate a reference frequency in response to said input frequency;
   a PLL logic circuit configured to generate said output frequency in response to said reference frequency and a feedback frequency; and
   a second switchable divider configured to generate said feedback frequency in response to said output frequency.

10. The apparatus according to claim 9, wherein said first and second switchable dividers are further configured in response to said multi-bit lock signal.

11. The apparatus according to claim 10, wherein:
    said first switchable divider comprises a first divider and a first multiplexer, wherein said first multiplexer is configured to select a first divided output frequency or said input frequency as said reference frequency; and
    said second switchable divider comprises a second divider, a third divider and a second multiplexer, wherein said multiplexer is configured to select a second divided output frequency or a third divided frequency as said feedback frequency.

12. The apparatus according to claim 11, wherein said second and third dividers are configured in series.

13. The apparatus according to claim 11, wherein said second and third dividers are configured in parallel.

14. The apparatus according to claim 11, wherein said second and third dividers comprise multi-channel dividers configured in response to said multi-bit lock signal.

15. An apparatus comprising:
    means for multiplying an input frequency in response to a lock signal;
    means for generating an output frequency in response to said input frequency;
    means for generating said lock signal; and
    means for (i) (a) selecting a reference frequency to be said input frequency and (b) selecting a first feedback ratio, when in a first mode and (ii) (a) selecting one of a plurality of divided frequencies of said reference frequency to be said input frequency and (b) selecting a second feedback ratio, when in a second mode, wherein (i) said selected divided frequency is selected in response to said multi-bit lock signal, (ii) a first bit of said multi-bit lock signal selects said first feedback ratio, and (iii) a second bit of said multi-bit lock signal selects said second feedback ratio.

16. A method for frequency and/or phase acquisition in a phase lock loop (PLL), comprising the steps of:
    (A) multiplying an input frequency in response to a lock signal;
    (B) generating said lock signal; and
    (C) (i) (a) selecting said reference frequency to be said input frequency and (b) selecting a first feedback ratio, when in a first mode and (ii) (a) selecting one of a plurality of divided frequencies of said reference frequency to be said input frequency and (b) selecting a second feedback ratio, when in a second mode, wherein (i) said selected divided frequency is selected in response to said multi-bit lock signal, (ii) a first bit of said multi-bit lock signal selects said first feedback ratio, and (iii) a second bit of said multi-bit lock signal selects said second feedback ratio.

17. The method according to claim 16, wherein step (A) further comprises:

increasing said first feedback ratio when in said first mode; and decreasing said second feedback ratio when in said second mode.

18. The method according to claim 16, wherein step (B) generates said lock signal in further response to an internal/external signal.

19. The method according to claim 16, wherein step (A) further comprises:

generating a reference frequency in response to said input frequency;

generating an output frequency in response to said reference frequency and a feedback frequency; and generating said feedback frequency in response to said output frequency.

20. The method according to claim 16, wherein step (A) further comprises:

selecting a first divided output frequency or said input frequency and presenting said reference frequency; and selecting a second divided output frequency or a third divided frequency and presenting said feedback frequency.

21. An apparatus comprising:

a phase lock loop (PLL) configured to multiply an input frequency to generate an output frequency in response to a lock signal; and a lock circuit configured to generate said lock signal in response to an external input derived independently from said PLL, wherein said PLL is configured to (i) select a reference frequency as said input frequency when in a first mode and (ii) select a divided frequency of said reference frequency as said input frequency when in a second mode, wherein either said first mode or said second mode is selected in response to said lock signal.

* * * * *